(12) United States Patent
Anand et al.

(10) Patent No.: US 10,749,469 B2
(45) Date of Patent: *Aug. 18, 2020

(54) TRANSFORMER BASED SHIELDED OSCILLATOR

(71) Applicant: INTERNATIONAL BUSINESS MACHINES CORPORATION, Armonk, NY (US)

(72) Inventors: Tejasvi Anand, Corvallis, OR (US); Mark A. Ferriss, Tarrytown, NY (US); Bodhisatwa Sadhu, Fishkill, NY (US); Alberto Valdes Garcia, Chappaqua, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/138,989

(22) Filed: Sep. 22, 2018

(65) Prior Publication Data

US 2019/0036485 A1 Jan. 31, 2019

Related U.S. Application Data

(63) Continuation of application No. 15/153,043, filed on May 12, 2016, now Pat. No. 10,153,727.

(51) Int. Cl.
    *H03B 5/12* (2006.01)
    *H03B 5/08* (2006.01)
    *H03B 5/18* (2006.01)

(52) U.S. Cl.
    CPC ............ *H03B 5/1231* (2013.01); *H03B 5/08* (2013.01); *H03B 5/1212* (2013.01);
    (Continued)

(58) Field of Classification Search
CPC .. H03B 5/1228; H03B 5/1231; H03B 5/1212; H03B 5/1296; H03B 5/1215; H03B 5/1852; H03B 2200/009
(Continued)

(56) References Cited

U.S. PATENT DOCUMENTS

| 7,053,722 B2* | 5/2006 | Rein ................... H03B 5/1847 331/117 R |
| 7,511,589 B2* | 3/2009 | Tarng ..................... H03B 5/04 331/117 D |

(Continued)

FOREIGN PATENT DOCUMENTS

| EP | 1187308 A2 | 3/2002 |
| EP | 1424776 A1 | 6/2004 |
| WO | 2007/040429 A1 | 4/2007 |

OTHER PUBLICATIONS

Sadhu, B. et al., "A Capacitance Boosted Full-Octave LC VCO Based 0.7 to 24 GHz Fractional-N Synthesizer"; IEEE Radio Frequency Integrated Circuits Symposium (RFIC), (2015); pp. 111-114.

(Continued)

*Primary Examiner* — Arnold M Kinkead
(74) *Attorney, Agent, or Firm* — Intelletek Law Group, PLLC; Gabriel Daniel, Esq.

(57) ABSTRACT

An oscillator includes a first output node and a second output node. There is a tank circuit coupled between the first output node and the second output node. There is a first transistor having a first node, a second node coupled to a current source, and a control node coupled to the second output node. There is a second transistor having a first node, a second node coupled to the current source, and a control node coupled to the first output node. There is a first inductor coupled in series between the first node of the first transistor and the first output node. There is a second inductor coupled (Continued)

in series between the first node of the second transistor and the second output node.

11 Claims, 6 Drawing Sheets

(52) U.S. Cl.
CPC ......... *H03B 5/1215* (2013.01); *H03B 5/1228* (2013.01); *H03B 5/1296* (2013.01); *H03B 5/1852* (2013.01); *H03B 2200/009* (2013.01)

(58) Field of Classification Search
USPC ......... 331/167, 117 FE, 177 V, 117 R, 117 D
See application file for complete search history.

(56) References Cited

U.S. PATENT DOCUMENTS

| | | | |
|---|---|---|---|
| 10,153,727 | B2* | 12/2018 | Anand ................ H03B 5/1228 |
| 2003/0141953 | A1 | 7/2003 | Haslett et al. |
| 2003/0231072 | A1 | 12/2003 | Mason |
| 2006/0279368 | A1 | 12/2006 | Rohde |
| 2010/0308929 | A1 | 12/2010 | Kitayama et al. |
| 2011/0032044 | A1 | 2/2011 | Lee et al. |
| 2013/0063218 | A1 | 3/2013 | Sadhu et al. |

OTHER PUBLICATIONS

Sadhu, B. et al., "A Linearized, Low-Phase-Noise VCO-Based 25-GHz PLL With Autonomic Biasing"; IEEE, J. Solid-State Circuits, (2013); vol. 48, No. 5, pp. 1138-1150.

Murphy, D. et al., "A VCO With Implicit Common-Mode Resonance"; In Proc. IEEE Int., Solid-State Circuits Conf., (2015); pp. 442-443.

Hegazi, E. et al., "A Filtering Technique to Lower LC Oscillator Phase Noise"; IEEE J. Solid-State Circuits, (2001); vol. 36, No. 12, pp. 1921-1930.

Li, Z. et al., "A Low-Phase-Noise and Low-Power Multiband CMOS Voltage-Controlled Oscillator"; Solid-State Circuits, IEEE Journal (2005); vol. 40:6; pp. 1296-1302.

* cited by examiner

TRANSFORMER BASED SHIELDED OSCILLATOR

STATEMENT REGARDING FEDERALLY SPONSORED RESEARCH OR DEVELOPMENT

This application has been written with Government support under Contract No.: FA8650-09-C-7924 (Defense Advanced Research Projects Agency (DARPA)). The Government has certain rights in this invention.

BACKGROUND

Technical Field

The present disclosure generally relates to electronic oscillators and, in particular, to a fully decoupled LC tank-based oscillator topology for low phase noise and high oscillation amplitude applications.

Description of the Related Art

A tank-based oscillator is a resonant circuit that includes inductance and capacitance that provides a waveform at the circuit's resonant frequency. Such oscillators are commonly found in many present electronic devices, including wireless and wireline communication applications, radars, sensors, data converters, imagers, and so forth.

Oscillator phase noise is a performance metric in many electronic applications. A clocked system typically benefits from a lower phase noise oscillator. One way to lower oscillator phase noise is to increase the amplitude of oscillation. Oscillator phase noise can also be lowered, for example, by using lower noise devices, higher breakdown devices, or by lowering the temperature. Since many oscillators are implemented as an integrated circuit (IC), the chip area occupied by the oscillator is another consideration. It is with respect to these considerations and others that the present disclosure has been written.

SUMMARY

According to an embodiment of the present disclosure, an oscillator includes a first output node and a second output node. There is a tank circuit coupled between the first output node and the second output node. There is a first transistor having a first node, a second node coupled to a current source, and a control node coupled to the second output node. Further, there is a second transistor having a first node, a second node coupled to the current source, and a control node coupled to the first output node. There is a first inductor coupled in series between the first node of the first transistor and the first output node. There is a second inductor coupled in series between the first node of the second transistor and the second output node.

In one embodiment, the tank circuit includes a capacitor coupled between the first output node and the second output node. There is a third inductor coupled between the first output node and a voltage source node. The tank circuit further includes a fourth inductor coupled between the second output node and the voltage source node.

In one embodiment, the first inductor, second inductor, third inductor, and fourth inductor are operated together as a coupled transformer.

According to another embodiment of the present disclosure, an oscillator is provided having an LC tank coupled between a first output node and a second output node, and a cross-coupled pair of transistors having control nodes coupled to the first output node and the second output node, respectively. The tank circuit is decoupled from the cross-coupled pair of transistors with a first series inductor between a first transistor of the cross-coupled pair and the tank circuit and a second series inductor between the second transistor of the cross-coupled pair and the tank circuit. An amplitude of oscillation of the tank circuit is increased while at least partially cancelling a voltage at a first node of the first transistor and a first node of the second transistor. The cross-coupled pair of transistors is linearized such that it does not readily enter the saturation region.

BRIEF DESCRIPTION OF THE DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all of the components or steps that are illustrated. When the same numeral appears in different drawings, it refers to the same or like components or steps.

DETAILED DESCRIPTION

In the following detailed description, numerous specific details are set forth by way of examples in order to provide a thorough understanding of the relevant teachings. However, it should be apparent that the present teachings may be practiced without such details. In other instances, well-known methods, procedures, components, and/or circuitry have been described at a relatively high-level, without detail, in order to avoid unnecessarily obscuring aspects of the present teachings.

The present disclosure generally relates to LC tank-based oscillators that may be used for low phase noise and high oscillation amplitude applications. The architectures discussed herein reduce phase noise by increasing oscillation amplitude and reducing injection of active device noise into the tank circuit. The tank quality factor (Q) is improved and/or its degradation of tank Q due to active device and bias circuit loading, is reduced. There is an increased oscillation amplitude at the oscillator LC tank, thereby improving the signal to noise ratio of the tank circuit. Further, the size of the oscillator circuit is reduced as compared to conventional oscillators that use an additional inductor to filter out noise.

Figure 1:
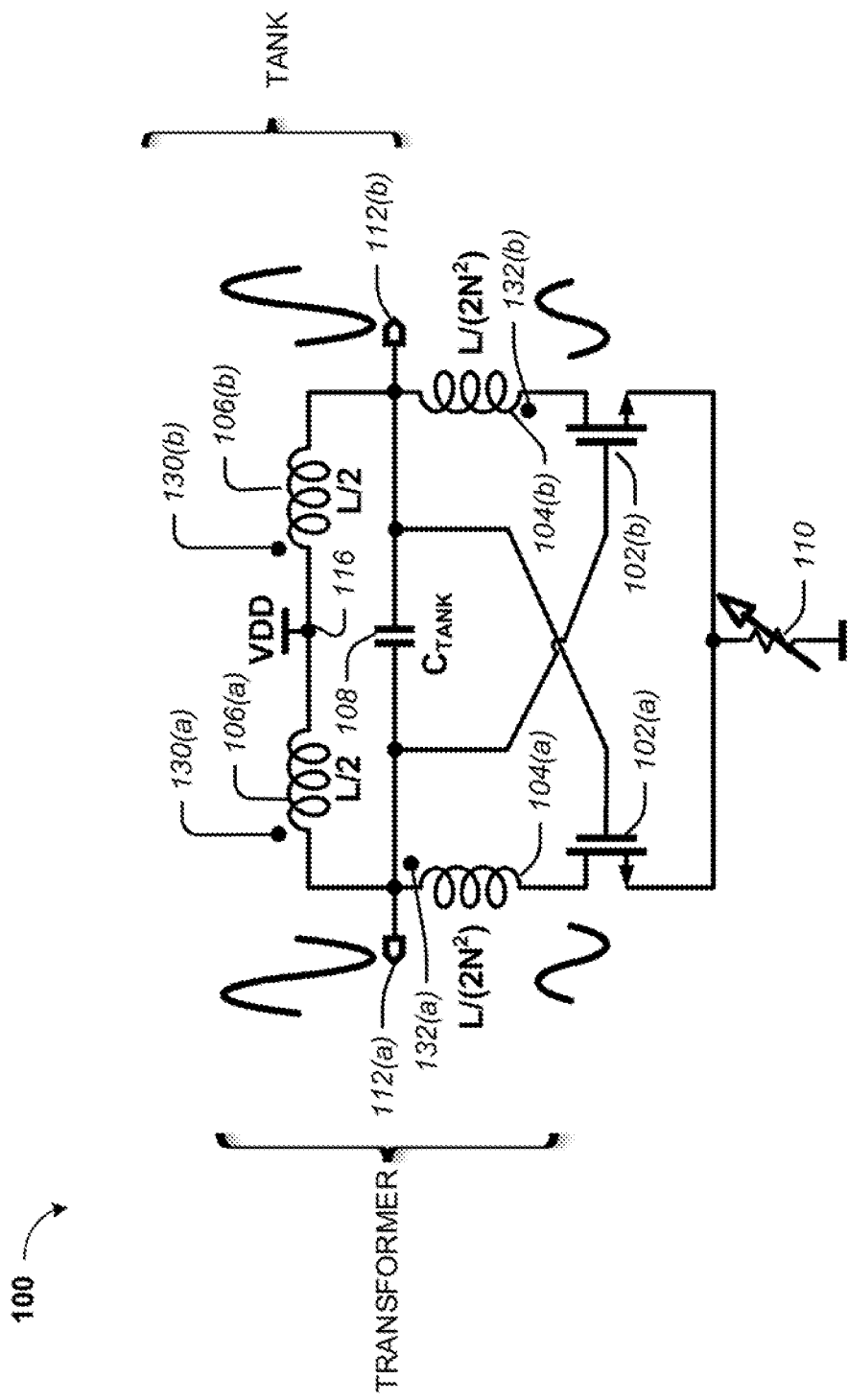
FIG. 1 illustrates an LC tank-based oscillator circuit, consistent with an exemplary embodiment.

Reference now is made in detail to the examples illustrated in the accompanying drawings and discussed below. FIG. 1 illustrates an LC tank-based oscillator circuit, consistent with an exemplary embodiment. The LC tank-based oscillator circuit 100 includes a first output node 112(a) and a second output node 112(b), which may be used together to provide a differential output. There is a tank circuit that includes a capacitor $C_{TANK}$ 108 and inductors 106(a) and 106(b). The capacitor 108 of the tank circuit is coupled between the first output node 112(a) and the second output node 112(b). The left inductor 106(a) of the tank circuit is coupled between the first output node 112(a) and a voltage source 116, represented in circuit 100 by way of example only and not by way of limitation as VDD. The right inductor 106(b) of the tank circuit is coupled between the second output node 112(b) and the voltage source 116. In one embodiment, inductors 104(a), 104(b), 106(a), and 106(b) are coupled via mutual inductance to operate together as a transformer and are therefore collectively referred to herein as the transformer.

Oscillator 100, sometimes referred to herein as the "hybrid oscillator," further includes a cross-coupled pair of transistors 102(a) and 102(b) having a common second node (e.g., emitter of each transistor). The common second node is coupled to a current source 110 that may be variable. In various embodiments, current source 110 may be a polysilicon resistor, a thin-film resistor, a diffusion resistor, a transistor current source, or any other appropriate current source.

Accordingly, the first transistor 102(a) has its second node (e.g., emitter) coupled to the current source 110 and its control node (e.g., gate) coupled to the second output node 112(b). There is a first inductor 104(a) coupled in series between the first node (e.g., drain) of the first transistor 102(a) and the first output node 112(a).

As is illustrated in FIG. 1, oscillator 100 includes a left half and a right half that are mutually similar. The two halves can be viewed as single-ended circuits that have been mated together (e.g., cross-coupled) to form a differential configuration. Accordingly, the right half of the oscillator 100 includes substantially similar features as those of the left half.

In particular, the second transistor 102(b) has its second node (e.g., emitter) coupled to the current source 110 and its control node (e.g., gate) coupled to the first output node 112(a). There is a second inductor 104(b) coupled in series between the first node (e.g., drain) of the second transistor 102(b) and the second output node 112(b). In one embodiment, (i) the connection between the control node (e.g., gate) of the first transistor 102(a) and the second output node 112(b), and (ii) the connection between the control node (e.g., gate) of the second transistor 102(b) and the first output node 112(a) are implemented as transmission lines. The beneficial use of the transmission lines is discussed in more detail in a later section.

Accordingly, both the first and second transistors (i.e., 102(a) and 102(b)) each have a series inductor (i.e., 104(a) and 104(b), respectively) between the transistor and the tank circuit. By virtue of the series inductors (i.e., 104(a) and 104(b)), there is isolation between the tank circuit and the active elements (i.e., first transistor 102(a) and second transistor 102(b)), while providing a direct-current (DC) path to the first node of the transistors (i.e., 102(a) and 102(b)). Thus, an additional passive component between the tank circuit and the active elements is not required to provide a DC path to the active components (i.e., transistors).

Further, the voltage dropped across the first series inductor 104(a) at least partially cancels out the voltage seen at the first node (e.g., drain) of the first transistor 102(a). In this regard, the inductors 104(a/b) and 106(a/b) may collectively be viewed as a transformer. It is noted that the first series inductor 104(a) has a dot 332(a) at the output node 112(a) end. The inductor 106(a) of the tank circuit has a dot 330(a) at the output node 112(a) end as well. Accordingly, if current enters the dotted node 330(a) of the inductor 106(a) of the tank circuit, the induced voltage at the dotted node 332(a) of the first series inductor 104(a) is positive. Similarly, the induced voltage of the second node of the first series inductor 104(a) (e.g., at the drain of transistor 102(a)) is negative.

Similar principles apply to the right side of the oscillator 100. The second series inductor 104(b) has a dot 332(b) at the first node end of the second transistor 102(b) (e.g., drain), while the inductor 106(b) of the tank circuit has a dot 330(b) at the voltage source (e.g., VDD) end.

Put differently, the first inductor has a dot polarity that is opposite to a dot polarity of the second inductor; the third inductor has a dot polarity that faces the dot polarity of the first inductor; and the fourth inductor has a dot polarity that faces the voltage source node.

Accordingly, if current enters the dotted node 330(b) of the inductor 106(a) of the tank circuit, the induced voltage at the dotted node 332(b) of the second series inductor 104(b) is positive. Similarly, the induced voltage of the second node of the second series inductor 104(b) (e.g., at the drain of transistor 102(b)) is negative.

Such architecture allows a higher tank amplitude without the first and second transistors 102(a/b) operating in the triode region. Put differently, the tank circuit is operated at a larger amplitude of oscillation, thereby improving the signal to noise ratio, while the first and second transistors 102(a/b) are operated at a smaller swing (at their first nodes, respectively), thereby allowing the first and second transistors 102(a/b) to operate in the linear region.

As mentioned above, in one embodiment, inductors 104(a), 104(b), 106(a), and 106(b) are combined into a transformer structure during operation. Put differently, the L/2 components of inductors 106(a) and 106(b), and the $L/2N^2$ components of inductors 104(a) and 104(b) are operated as a transformer, which reduces the swing on the corresponding transistors 102(a) and 102(b), as discussed in more detailed below.

It should be noted that unlike known oscillators that may use a choke inductor (e.g., coupled to the common second node of transistors 102(a) and 102(b)) to provide noise filtering and to reduce tank loading, the architecture discussed herein does not require a choke inductor, and therefore is not subject to the additional area penalty and complexity associated with introducing an additional choke inductor. Rather, the series inductors 104(a) and 104(b) provide noise filtering. The concept of area saving is discussed in more detail in a later section.

By virtue of the series inductors 104(a) and 104(b), the tank sees a high impedance in series with the linear resistance of transistors 102(a) and 102(b), respectively. Such isolation results in better noise immunity and other benefits, as will be appreciated in view of the discussion below.

Figure 2:
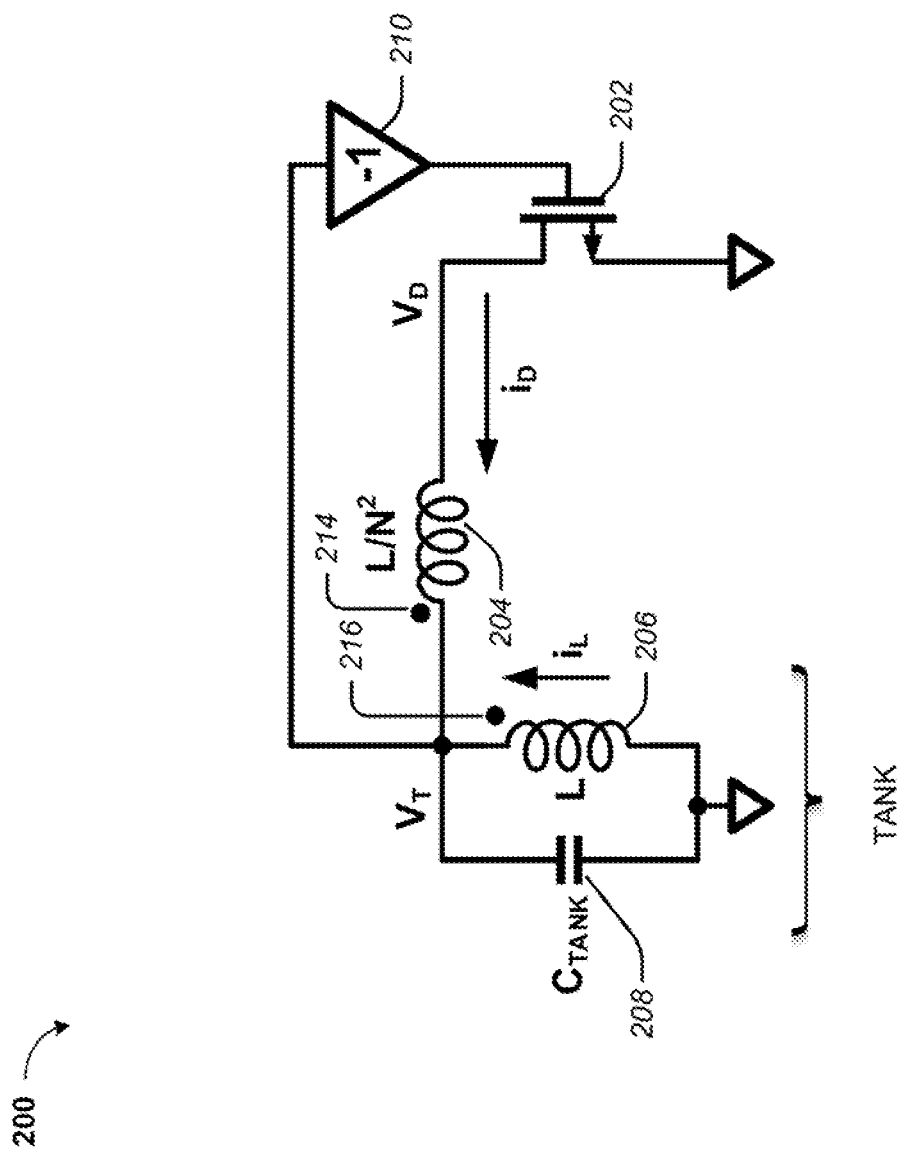
FIG. 2 illustrates an equivalent half-circuit for the LC tank-based circuit of FIG. 1, in accordance with an exemplary embodiment.

FIG. 2 provides an equivalent half-circuit 200 for the LC tank-based circuit of FIG. 1, in accordance with an exemplary embodiment. The half-circuit 200 includes a transistor 202 (similar to that of first transistor 102) and an LC tank circuit that includes a capacitance $C_{TANK}$ 208 in parallel with an inductor L 206. Accordingly, $C_{TANK}$ 208 represents the $C_{TANK}$ 108, and inductor L 206 represents the inductors 106(a/b) of FIG. 1. The tank circuit is isolated from the active device (i.e., transistor 202) by the second series inductor 204. The control node (e.g., gate) of the transistor 202 is coupled to the output of the LC tank circuit via an inverse gain stage 210.

By virtue of the architecture of FIG. 2 (and by extension, FIG. 1), various advantages are obtained, while it will be understood that not all embodiments are required to have all advantages. For example, by including the series second inductor 214 between the active device (e.g., transistor 202) and the tank circuit, the effective amplitude of the signal at the first node (e.g., drain) of the transistor is reduced. The voltage at the node VD (e.g., drain of the transistor 202) is provided by equation 1 below:

$$V_D = V_T \frac{N-1}{N} \quad \text{Eq. (1)}$$

where:

$V_T$ is the voltage at the output of the tank circuit; and
N is the turn ratio of the second series inductor 204 (which also represents the first and second series inductors 104(a) and 104(b)).

Further, having a series inductor 204 in series with the tank circuit reduces the effective transconductance ($G_{m\text{-}EFF}$) of the active device (e.g., transistor 202). The effective transconductance is provided by equation 2 below:

$$G_{m\text{-}EFF} = g_m\left(1 - \frac{1}{N}\right) \quad \text{Eq. (2)}$$

where:

gm is the transconductance of transistor 202; and
N is the turn ratio of the second inductor 204.

Next, there is an increased oscillation amplitude in the oscillator tank circuit (as seen at the output node $V_T$ in FIG. 2 and output nodes 112(a/b) in FIG. 1). The tank circuit is not loaded even at large tank amplitude of oscillation. As a result, there is an improved phase noise because the signal to noise ratio (SNR) improves. Such benefit is provided by virtue of the isolation (provided by the inductor 204) between the active circuit (e.g., transistor 202) and the tank circuit. For example, the impedance seen by the tank for the hybrid oscillator described herein is substantially higher than that of conventional oscillators that do not include the series inductive isolation. The impedance seen by the tank circuit (e.g., at node $V_T$ in FIG. 2) is provided by equation 3 below:

$$Z_{FROM-TANK} = \frac{\left(\frac{j\omega L}{N^2} + R_{LIN}\right)}{\left(1 - \frac{1}{N}\right)} \quad \text{Eq. (3)}$$

where:

$R_{LIN}$ is the impedance of the transistor 202 in the linear region;
L is the inductance of the inductor 204; and
N is the turn ratio of the second inductor 204.

Accordingly, the impedance seen by the tank is proportional to the impedance of the transistor 202 when operated in the linear region plus the $j\omega L/N^2$ component of the series second inductor 204. The impedance increases with oscillation frequency.

In contrast, the impedance of conventional oscillators that do not include the series inductive isolation discussed herein, is provided by way of example in equation 4 below:

$$Z_{FROM-TANK} = R_{LIN} \quad \text{Eq. (4)}$$

Accordingly, when the series second inductor 204 is not used, the impedance as seen by the tank circuit is reduced to $R_{LIN}$ and does not increase with frequency for some known architectures.

Further, for the architectures discussed herein, there is a reduced injection of the active device (e.g., 102(a) and 102(b)) noise into the LC tank circuit components due to the isolation provided by the series inductor (e.g., 104(a) and 104(b)) of FIG. 1 and the inductor 204 of FIG. 2).

Still further, there is an improved tank quality (Q) factor (or reduced degradation of tank Q). The Q factor is a dimensionless parameter that describes how under-damped a resonant structure (such as the tank circuit discussed herein) is. The Q factor characterizes the tank circuit's bandwidth relative to its center frequency. The higher the Q factor, the lower rate of energy loss relative to the stored energy of the resonator (e.g., tank). As discussed above, the impedance seen by the tank circuit increases with the introduction of an inductor (e.g., 204) in series with the active device (e.g., transistor 202). Put differently, the active device loading on the tank decreases due to the series inductor. Accordingly, the tank Q factor is degraded less and there is less waveform distortion than in the case of an oscillator that does not include the series inductor 204.

Figure 3:
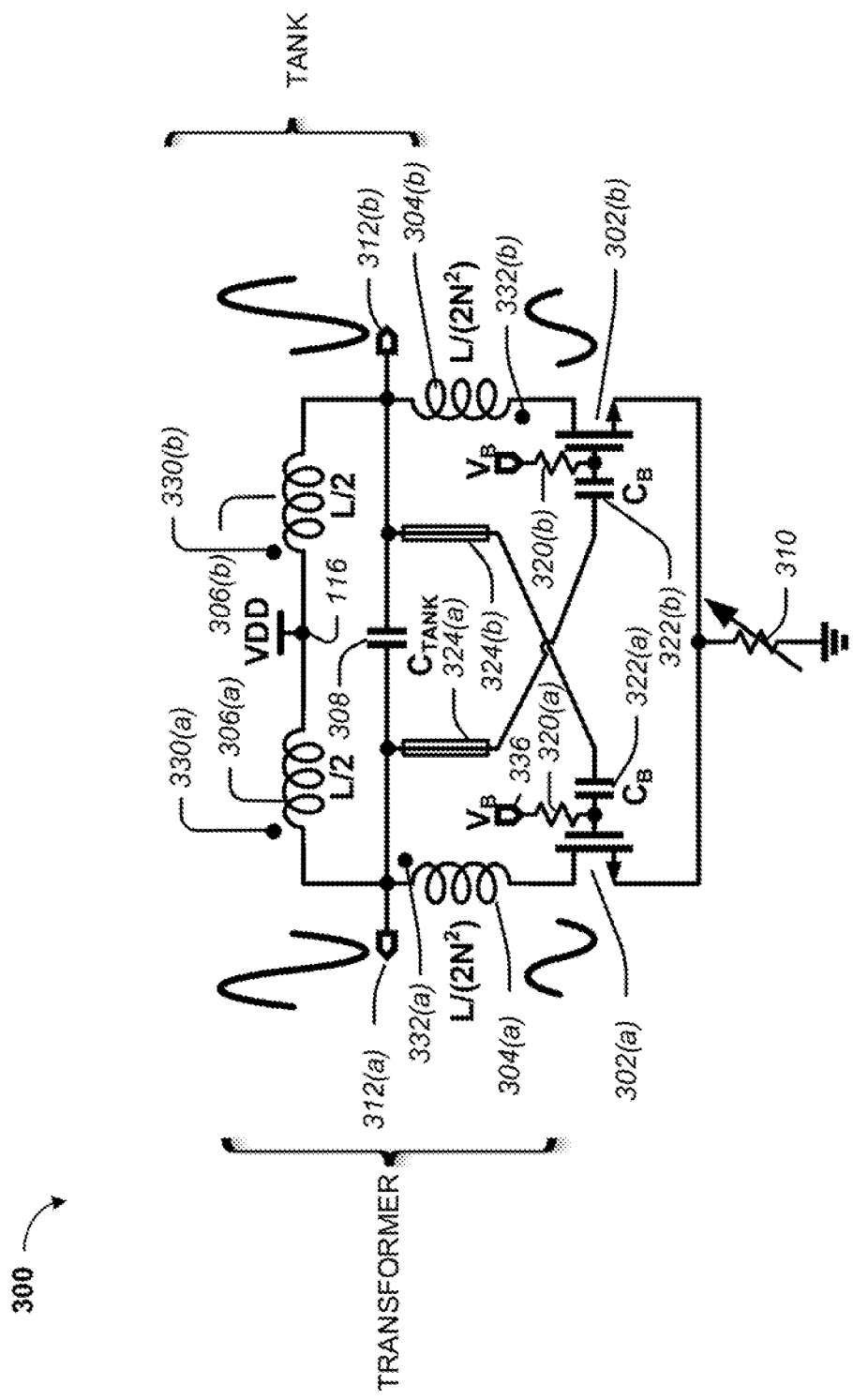
FIG. 3 illustrates an LC tank-based oscillator circuit including a bias reference, consistent with an exemplary embodiment.

Reference now is made to FIG. 3, which illustrates an LC tank-based oscillator circuit including a bias reference $V_B$, consistent with an exemplary embodiment. Some features are similar to those of FIG. 1 and are therefore not discussed in detail for brevity.

The LC tank-based oscillator 300 includes a first output node 312(a) and a second output node 312(b), which may be used together to provide a differential output. There is a tank circuit that includes a capacitor 308 and inductors 306(a) and 306(b). The capacitor $C_{TANK}$ 308 of the tank is coupled between the first output node 312(a) and the second output node 312(b). The left inductor 306(a) of the tank circuit is coupled between the first output node 312(a) and a voltage source 316 (e.g., $V_{DD}$). The right inductor 306(b) of the tank circuit is coupled between the second output node 312(b) and the voltage source 316.

Oscillator 300 further includes a cross-coupled pair of transistors 302(a) and 302(b) having a common second node (e.g., emitter of each transistor). The common second node is coupled to a current source 310 that may be variable.

There is a first inductor 304(a) coupled between the first node (e.g., drain) of the first transistor 302(a) and the first output node 312(a). The first transistor 302(a) has its second node (e.g., emitter) coupled to the current source 310. The control gate of the first transistor 302(a) (e.g., gate) is coupled to the second output node 312(b) via a series capacitor $C_B$ 322(a). In various embodiments, when the $C_B$ is sufficiently large (e.g., about ten times or more than the parasitic capacitance seen at the control node (e.g., gate) of the transistor 302(a)), the $C_B$ allows the control node (e.g., gate) to be biased independently of the first node (e.g., drain) of the transistor 302(a). If $C_B$ is sufficiently relatively small (e.g., less than ten times that of the parasitic capacitance seen at the control node (e.g., gate) of the transistor 302(a)), the $C_B$ provides linearization of the transistor 302(a).

Accordingly, decoupling capacitors $C_B$ 322(a) and 322(b) decouple the LC tank circuit from the control nodes (e.g., gates) of the active devices (i.e., transistors 302(a) and 302(b)).

In one embodiment, the connection between the series capacitor $C_B$ 322(a) and the second output node 312(b) can be implemented as a transmission line 324(b) to take advantage of the capacitance boost provided by the inductance of the transmission line. The concept of benefiting from the parasitics of the transmission line will be discussed in more detail below.

In one embodiment, there is an additional series resistance element 320(a) between a reference bias voltage $V_B$ node 336 and the control node (e.g., gate) of the transistor 302(a).

The right half of the oscillator 300 includes substantially similar features. In particular, there is a second inductor 304(b) coupled between the first node (e.g., drain) of the second transistor 302(b) and the second output node 312(b). The second transistor 302(b) has its second node (e.g., emitter) coupled to the current source 310. The control gate of the second transistor 302(a) (e.g., gate) is coupled to the second output node 312(a) via a series capacitor $C_B$ 322(b). The connection between the series capacitor $C_B$ 322(b) and the first output node 312(a) may be modeled as a transmission line 324(a).

Similar to the left side, in one embodiment, there is an additional series resistance element 320(b) between a reference bias voltage $V_B$ node 336 and the control node (e.g., gate) of the transistor 302(b).

By virtue of including the reference bias voltage $V_B$ node 336, the bias voltage of the first transistor 302(a) and second transistor 302(b) can be set, independent of the supply voltage (e.g., $V_{DD}$). In various embodiments, the bias voltage VB may be set a value that is above the threshold voltage VT of the transistors 302(a) and 302(b) but low enough to prevent the transistors from saturating. Accordingly, the bias voltage $V_B$ is set such that the transistors 302(a) and 302(b) are operated in the linear region.

Further, the coupling capacitors $C_B$ 322(a) and 322(b) at the control node (e.g., gate) of their corresponding transistors help reduce the voltage swing at the control node (e.g., gate). Such architecture extends the current limited region (i.e., linear region) and helps to increase the tank voltage amplitude at the expense of power. The restoring current is sent to the tank circuit, thereby achieving improved efficiency compared to known fully decoupled voltage controlled oscillator (VCO) topologies.

As mentioned above, the connection between the coupling capacitors $C_B$ 322(a) and 322(b), and the output nodes (i.e., 312(b) and 312(a), respectively) can be implemented as a transmission line, thereby achieving capacitance boosting of the coupling capacitors $C_B$ 322(a) and 322(b). For example, the transmission line has inductance that has an amplification effect of coupling capacitors $C_B$ 322(a) and 322(b). For example, when an inductive element is placed in series with $C_B$, the capacitance of $C_B$ is modified to an effective capacitance $C_{eff}$, as provided in equation 5 below:

$$\frac{1}{C_{eff}} = \frac{1}{C_B} - \omega_{osc}^2 L_{tline} \qquad \text{Eq. (5)}$$

where:
$C_B$ is the capacitance of the series capacitor 322(a) or 322(b); and $L_{tline}$ is the inductance of the transmission line 324(a) or 324(b).

Accordingly, for a predetermined desired decoupling capacitance value at the control node (e.g., gate) of the transistors (i.e., 302(a) and 302(b)), the actual capacitance value of $C_B$ can be reduced, thereby further saving chip real estate.

Figure 4:
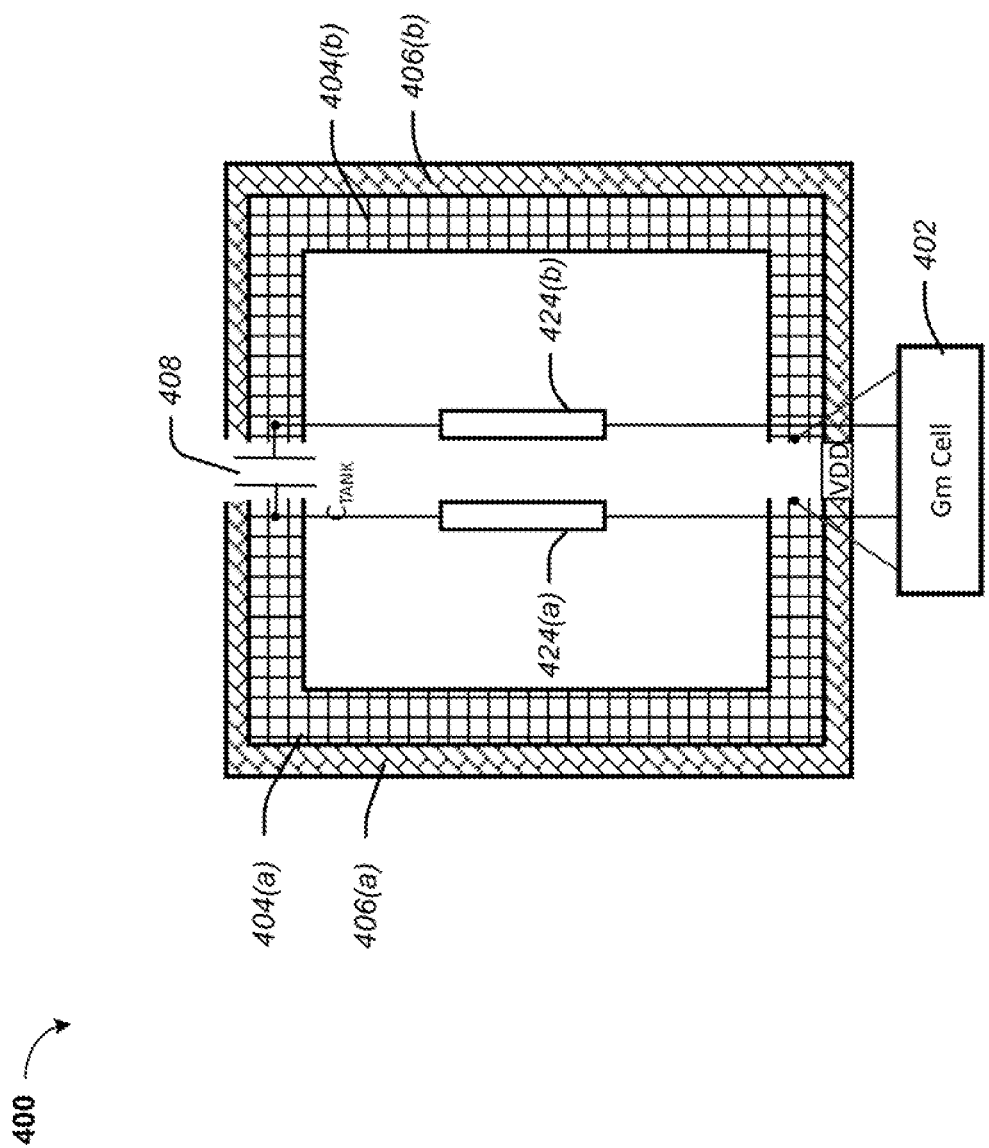
FIG. 4 illustrates an example floorplan for implementing a hybrid oscillator, similar to that of FIG. 1 or FIG. 3.

FIG. 4 illustrates an example floorplan for implementing a hybrid oscillator, similar to that of FIG. 1 and/or FIG. 3. Individual elements, such as transistors, are not included for simplicity. The floorplan of the hybrid oscillator 400 includes a Gm cell 402, series inductors 404(a) and 404(b), tank inductors 406(a) and 406(b), tank capacitor $C_{TANK}$ 408, and transmission lines 424(a) and 424(b). For example, series inductors 404(a) and 404(b) may correspond to the series inductors 304(a) and 304(b) of FIG. 3 respectively; inductors 406(a) and 406(b) may correspond to the tank inductors 306(a) and 306(b) of FIG. 3, respectively; and transmission lines 424(a) and 424(b) may correspond to transmission lines 324(a) and 324(b) of FIG. 3, respectively.

FIG. 4 emphasizes the overall compact floorplan of the hybrid oscillator 400. By way of example, FIG. 4 illustrates that the series inductors 404(a) and 404(b) may be placed (e.g., directly) on top of the tank inductors 406(a) and 406(b), respectively. In various other embodiments, the series inductors 404(a) and 404(b) may be placed (e.g., directly) beneath or next to the tank inductors 406(a) and 406(b). Accordingly, the first series inductor 404(a) and the second series inductor 404(b) form a first loop. The third inductor (i.e., tank inductor 406(a)) and the fourth inductor (i.e., tank inductor 406(b)) form a second loop, which may be on top of or beneath the loop formed by the first and second series inductors 404(a) and 404(b). By virtue of such floorplan, additional real estate is not required for the series inductors 405(a) and 404(b). Further, by placing the series inductors 404(a) and 404(b) on top of (or beneath) the tank inductors 406(a) and 406(b), a desirable coupling is established, as discussed previously. While two layers are illustrated in the example of FIG. 4, structures including multi-turn inductors are also envisioned by, for example, using additional layers of metal.

Simulation Results

Figures 5, 6:
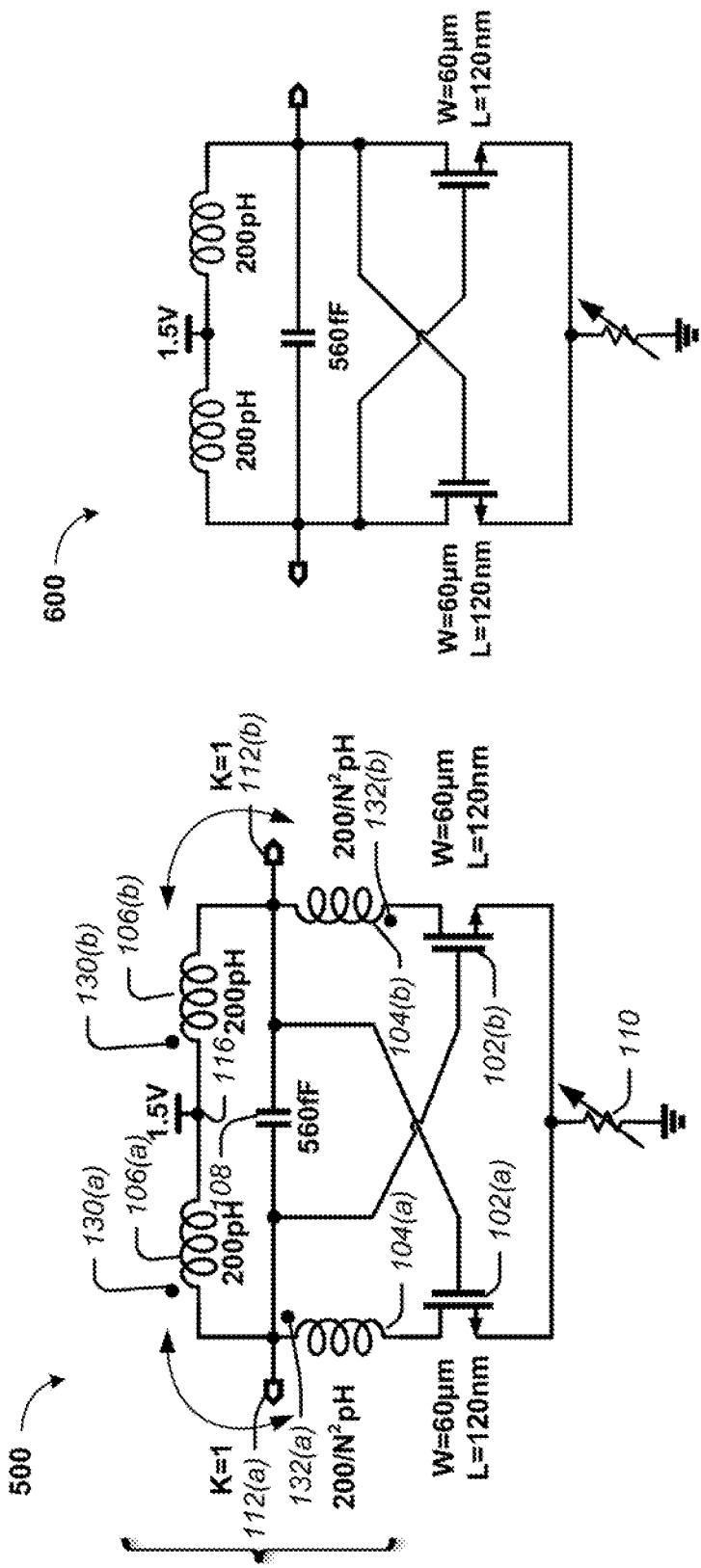
FIG. 5 illustrates a test bench implementation of a hybrid oscillator, consistent with an exemplary embodiment.
FIG. 6 illustrates an alternate oscillator that does not include series inductors to provide a comparison for the hybrid oscillator architecture of FIG. 5.

With the foregoing overview of the hybrid oscillator it may be helpful to provide a test bench and simulation results thereof. In this regard, FIG. 5 illustrates a test bench implementation of a hybrid oscillator, consistent with an exemplary embodiment. FIG. 6 illustrates an alternate oscillator that does not include series inductors, to be used as a comparison for the hybrid oscillator architecture of FIG. 5.

The components of oscillator circuit 500 are similar to those of FIG. 1 and are therefore not discussed here in detail for brevity. In the example of FIG. 5, transistors 502(a) and 502(b) have a W/L of 60 µm/120 µm. Tank inductors 506(a) and 506(b) have an inductance of 200 pH. Series inductors 504(a) and 504(b) have an inductance of $200/N^2$ pH. The tank capacitor 508 has a capacitance value of 560 fF. It will be understood that these dimensions and values are provided by way of example only and not limitation.

As to the reference circuit 600, which does not include the series inductors (i.e., 504(a) and 504(b)) of FIG. 5, it is configured to have some components of similar dimension. In particular, transistors 602(a) and 602(b) have a W/L of 60 µm/120 µm, tank inductors 606(a) and 606(b) have an inductance of 20 pH, and tank capacitor 608 has a capacitance of 560 fF.

By way of demonstrative example, both circuits 500 and 600 are configured to oscillate at 10 GHz, the tank Q factor is set to 15 at 10 GHz. In circuit 500, the series inductors 504(a) and 504(b) are set to have no resistance in series.

Figure 7A:
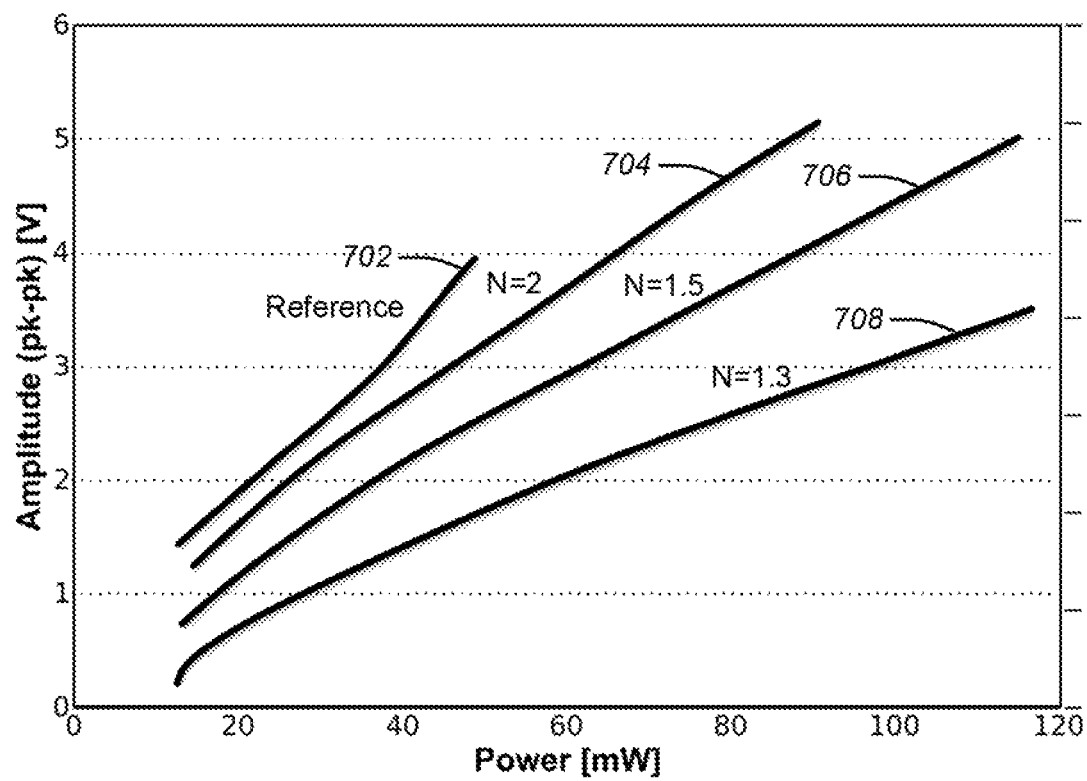
FIG. 7A illustrates graphs of peak to peak amplitude versus power for various configurations of oscillators.
Figure 7B:
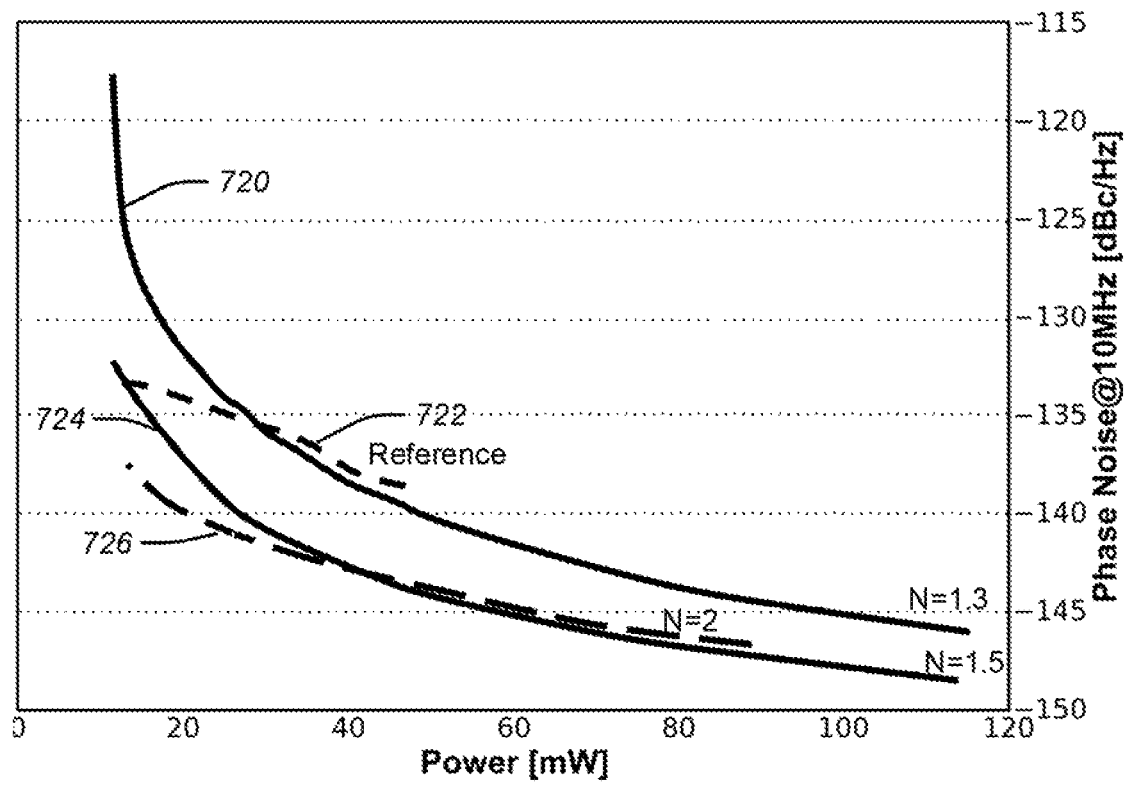
FIG. 7B illustrates graphs of phase noise versus power for various configurations of oscillators.

FIGS. 7A and 7B provide the results of the experiment related to FIGS. 5 and 6. In particular, FIG. 7A illustrates peak to peak amplitude versus power for different turn ratios N of the transformer. Waveform 702 represents the reference case (related to FIG. 6). The remaining waveforms of FIG. 7A relate to FIG. 5. Waveform 704 represents a turn ratio N=2; waveform 706 represents a turn ratio of N=1.5; and waveform 708 represents a turn ratio of N=1.3.

FIG. 7B illustrates phase noise at 10 MHz vs. power. Waveform 722 represents the reference case (related to FIG. 6). The remaining waveforms of FIG. 7B relate to FIG. 5. Waveform 720 represents a turn ratio of N=1.3; waveform 724 represents a turn ratio of N=1.5; and waveform 726 represents a turn ratio of N=2.

The waveforms of FIGS. 7A and 7B collectively indicate that phase noise and amplitude improves as the turn ratio N is reduced. However, there is an optimum value of N, beyond which the $Gm_{EFFECTIVE}$ degradation begins to degrade the tank amplitude and phase noise. The waveforms also indicate that the peak to peak amplitude performance and the phase noise performance of the hybrid architecture is superior to that of the reference case.

CONCLUSION

The descriptions of the various embodiments of the present teachings have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

While the foregoing has described what are considered to be the best state and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

The components, steps, features, objects, benefits and advantages that have been discussed herein are merely illustrative. None of them, nor the discussions relating to them, are intended to limit the scope of protection. While various advantages have been discussed herein, it will be understood that not all embodiments necessarily include all advantages. Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

Numerous other embodiments are also contemplated. These include embodiments that have fewer, additional, and/or different components, steps, features, objects, benefits and advantages. These also include embodiments in which the components and/or steps are arranged and/or ordered differently. For example, any signal discussed herein may be scaled, buffered, scaled and buffered, converted to another state (e.g., voltage, current, charge, time, etc.), or converted to another state (e.g., from HIGH to LOW and LOW to HIGH) without materially changing the underlying control method. Further, bipolar transistors (e.g., PNP or NPN) can be used instead of MOS transistors in the figures described herein. A PNP may be used instead of NPN, and a PMOS may be used instead of NMO S. Accordingly, it is intended that the invention be limited only in terms of the appended claims.

While the foregoing has been described in conjunction with exemplary embodiments, it is understood that the term "exemplary" is merely meant as an example, rather than the best or optimal. Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

What is claimed is:

1. An oscillator circuit comprising:
a first output node and a second output node;
a tank circuit coupled between the first output node and the second output node;
a first transistor having a first node, a second node coupled to a current source, and a control node coupled to the second output node;
a second transistor having a first node, a second node coupled to the current source, and a control node coupled to the first output node;
a first inductor coupled in series between the first node of the first transistor and the first output node;

a second inductor coupled in series between the first node of the second transistor and the second output node, wherein the first inductor has a dot polarity that is opposite to a dot polarity of the second inductor.

2. The oscillator circuit of claim 1, wherein the tank circuit comprises:
 a capacitor coupled between the first output node and the second output node;
 a third inductor coupled between the first output node and a voltage source node; and
 a fourth inductor coupled between the second output node and the voltage source node.

3. The oscillator circuit of claim 2, wherein the third inductor has a dot polarity that faces a dot polarity of the first inductor.

4. The oscillator circuit of claim 2, wherein the fourth inductor has a dot polarity that faces the voltage source node.

5. The oscillator circuit of claim 2, wherein the first and second inductors each have an inductance of $L/(2N^2)$, where L is an inductance of the tank circuit and N is a turn ratio of the first and second inductors.

6. The oscillator circuit of claim 2, wherein the third and fourth inductors each have an inductance of $L/2$, where L is an inductance of the tank circuit and N is a turn ratio of the first and second inductors.

7. The oscillator circuit of claim 1, wherein:
 the first transistor and the second transistor are metal oxide field effect transistors (MOSFETs); and
 for each of the first and second transistors, the first node is a drain, the control node is a gate, and the second node is a source.

8. The oscillator circuit of claim 1, wherein:
 the first transistor and the second transistor are bipolar junction transistors (BJTs); and
 for each of the first and second transistors, the first node is a collector, the control node is a base, and the second node an emitter.

9. The oscillator circuit of claim 2, wherein:
 the first inductor is placed on top of or beneath the third inductor; and
 the second inductor is placed on top of or beneath the fourth inductor.

10. The oscillator circuit of claim 2, wherein:
 the first and second inductors form a first loop, and
 the third and fourth inductors form a second loop.

11. An oscillator circuit comprising:
 a first output node and a second output node;
 a tank circuit coupled between the first output node and the second output node, comprising
  a capacitor coupled between the first output node and the second output node;
  a third inductor coupled between the first output node and a voltage source node; and
  a fourth inductor coupled between the second output node and the voltage source node;
 a first transistor having a first node, a second node coupled to a current source, and a control node coupled to the second output node;
 a second transistor having a first node, a second node coupled to the current source, and a control node coupled to the first output node;
 a first inductor coupled in series between the first node of the first transistor and the first output node; and
 a second inductor coupled in series between the first node of the second transistor and the second output node, wherein the first and second inductors each have an inductance of $L/(2N^2)$, where L is an inductance of the tank circuit and N is a turn ratio of the first and second inductors.

* * * * *